(12) United States Patent
Toyoshima et al.

(10) Patent No.: US 6,774,314 B2
(45) Date of Patent: Aug. 10, 2004

(54) ELECTRONIC DEVICE AND COUPLER

(75) Inventors: Toshiyuki Toyoshima, Tokyo (JP); Suguru Nagae, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 128 days.

(21) Appl. No.: 10/014,886

(22) Filed: Dec. 14, 2001

(65) Prior Publication Data

US 2003/0067313 A1 Apr. 10, 2003

(30) Foreign Application Priority Data

May 10, 2001 (JP) ........................................ 2001-140001

(51) Int. Cl.[7] ................................................ H05K 1/16
(52) U.S. Cl. ...................... 174/260; 174/261; 361/760; 361/768; 361/779; 257/738; 257/778; 257/779
(58) Field of Search ................................ 174/260, 261; 361/760, 743, 767, 768, 779; 257/778, 738, 779, 780, 786, E23.069, 737, 746, 748; 228/180.21, 180.22, 175, 254

(56) References Cited

U.S. PATENT DOCUMENTS 6,005,292 A * 12/1999 Roldan et al. ............... 257/777
6,064,120 A * 5/2000 Cobbley et al. ............. 257/780
6,249,051 B1 * 6/2001 Chang et al. ................ 257/737
6,358,627 B2 * 3/2002 Benenati et al. ............ 428/612
6,465,082 B1 * 10/2002 Takezawa et al. .......... 428/209

FOREIGN PATENT DOCUMENTS

| JP | 5-259166 | 10/1993 |
| JP | 5-275485 | 10/1993 |
| JP | 7-312400 | 11/1995 |
| JP | 410173006 A * | 1/1998 |
| JP | 11233682 A * | 8/1999 |

* cited by examiner

Primary Examiner—Luan Thai
Assistant Examiner—J B Patel
(74) Attorney, Agent, or Firm—Leydig, Voit & Mayer, Ltd.

(57) ABSTRACT

An electronic device assembled using a coupler which has an electroconductive region and a resin region on the surface. Flexibility of the resin region absorbs stress caused by difference in thermal expansion coefficient between an organic printed circuit board and a semiconductor chip through the deformation of the electroconductive region. As a result, formation of cracking in the coupler is avoided. It is preferable that the resin region occupies from 20 to 80% of the total surface area of the coupler. The coupler may be formed from a molten blend of the heat resistant resin and a joining metal. The coupler may also be formed by molding a blend of the heat resistant resin and metal powder, wherein the metal powder locating on the surface of the coupler have a joining metal joined thereto.

11 Claims, 6 Drawing Sheets

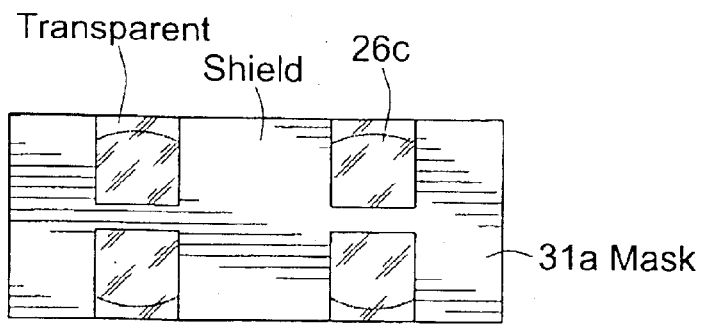
FIG. 7A
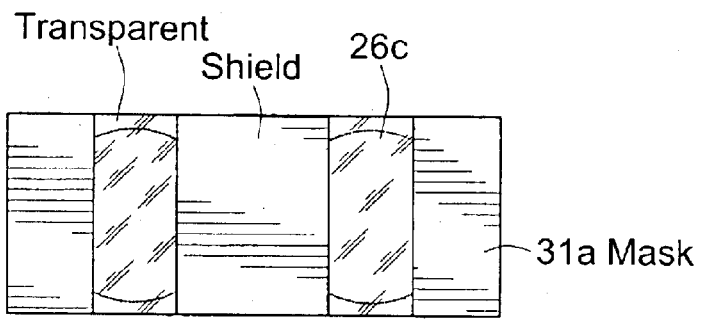
FIG. 7B
FIG. 8A
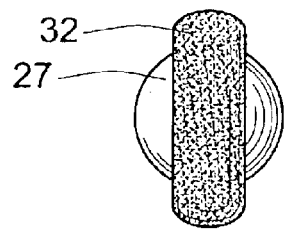
FIG. 8B
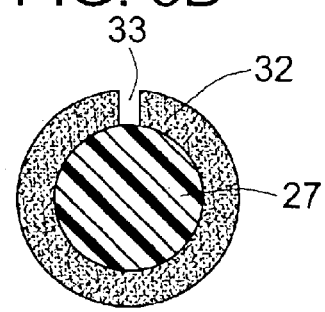
FIG. 9
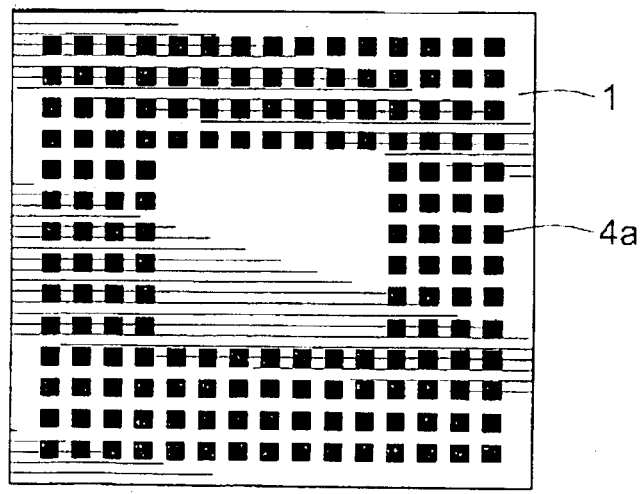

| Number of Cycles | 100 | 200 | 400 | 600 | 800 | 1000 |
|---|---|---|---|---|---|---|
| Connecting Member 20a | 0/88 | 0/88 | 0/88 | 0/88 | 0/88 | 0/88 |
| Connecting Member 20b | 0/88 | 0/88 | 0/88 | 0/88 | 0/88 | 0/88 |
| Connecting Member 20c | 0/88 | 0/88 | 0/88 | 0/88 | 0/88 | 0/88 |
| Connecting Member 20d | 0/88 | 0/88 | 0/88 | 0/88 | 0/88 | 0/88 |
| Connecting Member 20e | 0/88 | 0/88 | 0/88 | 0/88 | 0/88 | 0/88 |
| Connecting Member 20f | 0/88 | 0/88 | 0/88 | 0/88 | 0/88 | 0/88 |
| Sparkle Ball S-type | 0/88 | 0/88 | 0/88 | 0/88 | 8/88 | 15/88 |
| Sparkle Ball C-type | 0/88 | 0/88 | 2/88 | 8/88 | 10/88 | 12/88 |
| Coper Ball | 0/88 | 0/88 | 1/88 | 5/88 | 12/88 | 13/88 |

ELECTRONIC DEVICE AND COUPLER

BACKGROUND OF THE INVENTION

1. Field of the Invention

The present invention relates to a coupler suitable for joining substrates with different thermal expansion coefficients, such as a semiconductor chip, and an organic printed circuit board, to construct a multi-layer structure.

2. Description of the Related Art

In a field of assembling constitutional components or elements of an electronic device, solder balls are generally used to connect a semiconductor chip (such as a silicon chip) with an organic printed circuit board to mount the semiconductor chip. The semiconductor chip has a thermal expansion coefficient of about 3 ppm/° C., whereas the organic printed circuit board has a thermal expansion coefficient as large as 20 to 60 ppm/° C. The difference in thermal expansion coefficients between the semiconductor chip and the organic printed circuit board induces stress on the electronic device with an increase in temperature. There are cases where the stress forms cracks on the solder balls used for connecting the semiconductor chip and then causes a conduction failure of the device.

Various methods have been proposed to relax the stress. For example, FIG. 15 shows a method of applying a resin 3 around solder balls 2 to reinforce the connection with a semiconductor chip 1. The solder balls 2 connect pads (electrodes) 4a and 4b located face to face. A copper wiring layer 6 is formed inside the organic printed circuit board 5 to make an electrical connection to the pad 4b.

FIG. 16 shows a method of forming an underfill layer 7 made from thermosetting resin containing a ceramic filler, such as silica, between a semiconductor chip 1 and an organic printed circuit board 5. In this method, the entire surroundings of the solder balls 2 are covered with the resin, which reinforces the connection between the semiconductor chip 1 and the organic printed circuit board 5.

In these methods which use a resin as a reinforcing material, specific production equipment is required and a step of forming a resin layer, in addition to a step of connecting the solder balls, is necessarily employed, increasing the cost of manufacturing the device. Furthermore, in the method shown in FIG. 16, because the semiconductor chip 1 and the organic printed circuit board 5 are firmly adhered to each other and generate stress, there are cases 1) where the semiconductor chip 1 is broken, 2) where the organic printed circuit board 5 is warped and 3) where voids which are likely to be formed in the underfill layer 7 leading to cracking between the semiconductor chip 1 and the organic printed circuit board 5.

FIG. 17 shows a method of using wire bonds 8 which are formed to connect a semiconductor chip 1 and an organic printed circuit board 5 instead of the solder balls 8. Special production equipment is required to perform the process by this method and increased steps inevitably increase the cost of a device.

Japanese Patent Laid-Open No. Hei 5-259166 discloses a method of forming a structure on an electrode of a semiconductor chip, where metal dendrites made from copper, etc., grown on the electrode, are filled up with a resin. However, this method has such problems that (1) specific production equipment different from the conventional equipment is necessarily employed, making the production process complicated and increasing the production cost, (2) it is difficult to form the metal dendrites uniformly, and (3) filling the resin among the metal dendrites is likely to form voids to deteriorate the reliability of the semiconductor chip.

Japanese Patent Laid-Open No. Hei 5-275485 discloses a structure in which a metal layer has an H cross-section, the circumference of which is covered with a resin, so as to prevent the formation of bump cracks. However, it requires a lithographic process and a plating process for forming the metal layer and the resin layer, which are relatively expensive steps in manufacturing an electronic device.

Japanese Patent Laid-Open No. Hei 7-312400 discloses a method which uses a thin wire as an electrode of wire bonding to form junctions, wherein the thin wire includes a core made from a resin, a ceramic or a high melting point metal and a covering of the core made from a low melting point solder. In recent years, semiconductor chips have increased in the number of electrodes for input and output, and may reach as many as one thousand and more. The increase of electrodes in number will make it disadvantageous to form a solder layer for connecting by the wire bonding method from the standpoint of tact time of the process.

SUMMARY OF THE INVENTION

The invention has been made to solve the foregoing problems associated with the conventional methods, and an object of the invention is to achieve highly reliable parts assembling on the basis of the solder ball techniques which have been generally employed.

The present invention is to provide an electronic device assembled using a coupler which is capable of connecting an element carrying substrate and a wiring substrate with high reliability. According to the invention, there is provided an electronic device which comprises: an element carrying substrate having an electronic element and a first electrode, the first electrode disposed on a surface of the element carrying substrate and having a prescribed area; a wiring substrate arranged to face the element carrying substrate and having a second electrode disposed on a surface of the wiring substrate, the second electrode having a prescribed area and facing the first electrode; and a coupler disposed between the first electrode and the second electrode to join the element carrying substrate and the wiring substrate, the coupler having a resin body and an electroconductive member, the surface of the coupler comprising a resin region and an electroconductive region to thereby electrically connect the first electrode and the second electrode.

It is preferable that the resin region occupies from 20 to 80% of the surface of the coupler.

The coupler may be formed from a blend of the heat resistant resin and a joining metal to make a resin region and an electroconductive region, respectively.

The coupler may be formed by molding a blend of the heat resistant resin and metal powders, wherein metal powders locating on the surface of the coupler have a joining metal joined thereto.

The coupler may be formed from a heat resistant resin, wherein an encircling metal strip with a joined metal joined thereto is formed on the surface of the resin to make the electroconductive region. The encircling metal strip on the surface of the coupler may have an opening.

It is to be understood that both the foregoing general description and the following detailed description are exemplary, but not restrictive, of the invention.

BRIEF DESCRIPTION OF THE DRAWINGS

FIGS. 7A and 7B are diagrams showing masks 31a and 31b used for exposing resin to obtain a resin ball.

FIGS. 8A and 8B are an elevational view and a side view, respectively, showing an appearance of a resin ball.

FIG. 9 is a bottom view of a semiconductor chip with a plurality of electrodes (pads) having a prescribed area formed thereon.

DESCRIPTION OF THE PREFERRED EMBODIMENTS

Figure 1:
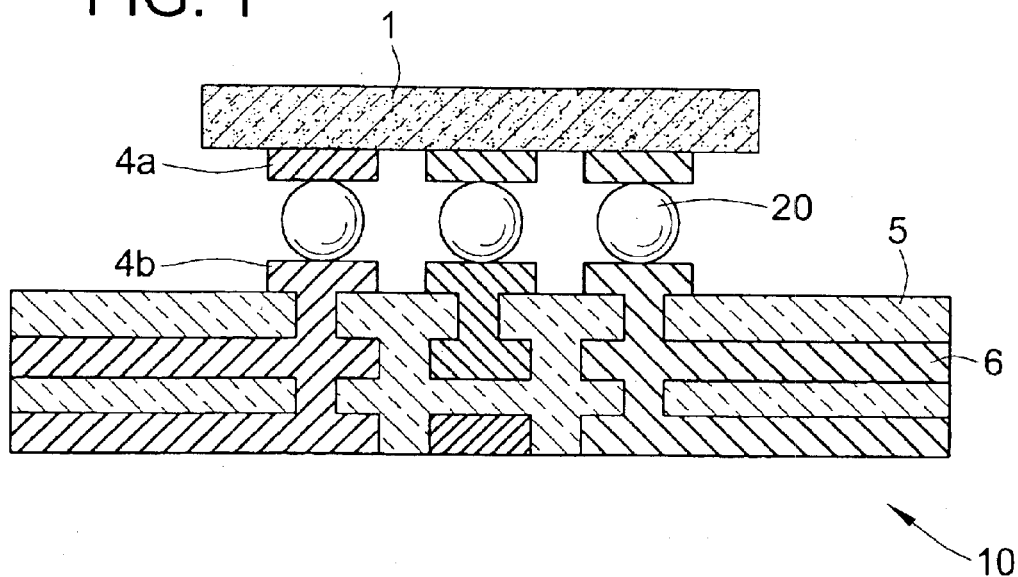
FIG. 1 is a cross sectional view showing an electronic device according to the invention.

The invention will be described in detail below with reference to the drawings of embodiments. FIG. 1 is a cross sectional view showing an electronic device 10 according to the invention. Semiconductor elements (not shown in the figure) having a prescribed function are mounted on a semiconductor chip 1 (element carrying substrate; such as a silicon chip and a GaAs chip). Pads 4a (electrodes) having conduction with the semiconductor elements are formed on an active surface of the semiconductor chip 1. An organic printed circuit board 5 (wiring substrate; such as an FR4 substrate), which is joined with the semiconductor chip 1, includes copper wiring layers 6 formed therein and pads 4b disposed at positions facing the pads 4a. The pads 4a and pads 4b are connected with couplers 20.

The coupler 20 is formed by molding a heat resistant resin as a base material, and a part of the surface thereof is covered with a joining metal, such as soft solder, hard solder and braze, to form an electroconductive region. Although the surface of the coupler 20 is covered with the joining metal, some surface area of the heat resistant resin is necessarily open to form a resin region. Since the heat resistant resin is flexible, stress caused by difference in thermal expansion coefficient between the organic printed circuit board and the semiconductor chip is absorbed by the coupler through the deformation of the hard electroconductive region. As a result, formation of cracking in the coupler 20 is avoided, so as to achieve parts assembling with high reliability.

When the entire surface of the coupler 20 is covered with the joining metal, such as solder, cracking is likely to be formed since the stress is not relaxed. Increasing the area of the resin region formed with the heat resistant resin, however, reduces the electrical-conductivity of the coupler 20. In order to avoid the cracking formation with holding enough electrical-conductivity, the resin region is preferably in the range of from 20 to 80%, and more preferably from 30 to 70% to the total surface area of the coupler 20.

The size and the shape of the coupler 20 may be those equivalent to a conventional solder ball. Therefore, there is no need to install production equipment for connecting substrates with the couplers 20, and thus the invention can be conveniently applied to mass production.

The size of the coupler 20 may be appropriately determined on the basis of the pad pitch. For example, in the case of a semiconductor device where fine-patterning with high reliability is in progress, the diameter of the coupler 20 is associated with the pitch d of the pads and is preferably from 0.5 to 2 times the pitch d.

A resin of the coupler 20 is required to have heat resistance because it needs to hold the prescribed shape (for example, a spherical shape) during a dipping treatment in a heat-melted solder bath and the subsequent solder treatment. The resin thereof includes a thermoplastic resin, such as polybutylene terephthalate (PBT), polyacetal (POM), polyphenylene sulfide (PPS), a vinyl chloride resin (PVC), high density polyethylene (HDPE), polystyrene (PS), an AS resin (AS), an ABS resin (ABS), a methacrylate resin (PMMA), low density polyethylene (LDPE), polypropylene (PP), polyamide (PAI), polycarbonate (PC), modified polyphenylene ether (PPE), polysulfone (PS) and a liquid crystal polymer (LCP). These resins are suitable for injection molding and easily recycled.

A thermosetting resin, such as an epoxy resin (EP), a polyimide resin (PI), benzocyclobutene (BCB), a phenol resin (PF), a urea resin (UF), a melamine resin (MF), an unsaturated polyester resin (UP) and a silicone resin (Si), may also be used. These resins are suitable for mixing with solder with a high melting point owing to high heat resistance thereof.

The resin is not necessarily used singly and can be used as a blend. The thermal expansion coefficient and the heat resistance of the resin are adjusted by mixing both a thermoplastic resin and a thermosetting resin, mixing two or more of the thermosetting resins, or mixing two or more of thermoplastic resins. A filler (such as fibers and powders) made of a metal or ceramics may be mixed with the resin for the same purpose.

A method of molding the coupler 20 into a spherical form is not particularly limited as far as a ball form (spherical form) is obtained. The method thereof includes a molding method in a metal cast, a molding method through injection, and a method using scraping.

The foregoing description shows an example where the semiconductor chip 1 is mounted on the wiring substrate (organic printed circuit board) by using the coupler 20, but the coupler 20 is not limited to such an application and may be suitably used for connecting substrates having different thermal expansion coefficients with high reliability. A wide variety of element carrying substrates on which electronic elements are mounted, such as a silicon sensor (distortion sensor, etc.), a thin film magnetic head and a ceramic chip (a ceramic substrate including a plurality of semiconductor chips thereon), can be connected with a wiring substrate by using the coupler 20.

While there has been described a form of the invention where two plies of substrates are stacked, it is to be understood that the number of substrates to be stacked is not particularly limited.

Embodiments of the coupler 20 according to the invention will be described with reference to the process for producing them. It is obvious that the invention is not construed as being limited in terms of the kinds and the mixing ratio of the resin and the solder referred herein.

Embodiment 1

Figure 2:
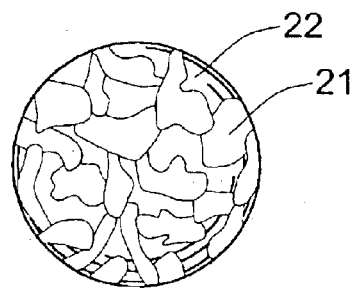
FIG. 2 is a diagram showing an appearance of a coupler.

A coupler 20a of Embodiment 1 is formed from a blend of solder and resin. A solder region 21 (electroconductive region) and a resin region 22 are alternately formed on the surface of the coupler 20a as shown in FIG. 2. The solder region 21 is not necessarily continuous on the surface. Even when it is discontinuous, melted solder will make a continuous path to ensure electrical-conduction at the process of connecting the pads 4a and 4b. A process for producing the coupler 20a having such a structure will be described below with reference to the embodiment.

To 30 g of molten solder (ECO Solder M31, produced by Senju Metal Industry Co.), 30 g of a polyester resin (Siveras, produced by Toray Industries, Inc.) were mixed in a crucible and melted by heating at 300° C. under a nitrogen stream to prevent progress of oxidation, and the mixture were then agitated for 15 minutes. The mixed liquid was then injected in a stainless steel cast, followed by cooling, to obtain a coupler 20a.

While the same weights of the solder and the resin were mixed in the foregoing description, the mixing ratio of the solder and the resin can be appropriately selected. When the amount of the solder thus mixed was small, the formation of the solder region 21 on the surface became insufficient, and thus the conduction between the pads 4a and 4b was not assured. When the amount of the solder thus mixed was increased, the conductivity was increased, but the flexibility of the coupler 20a was lowered to deteriorate the resistance to cracking. In the case where the solder was mixed in a range of from 20 to 80% by weigh with respect to the coupler, the conduction between the pads 4a and 4b was assured without deteriorating the resistance to cracking.

A metal or an alloy of a low melting point may be mixed with the heat resistant resin instead of solder. In this case, it is preferable to dip resin balls formed from a mixture with melted molten solder in a solder crucible for about one second to form the solder region 21.

Embodiment 2

Figure 3A:
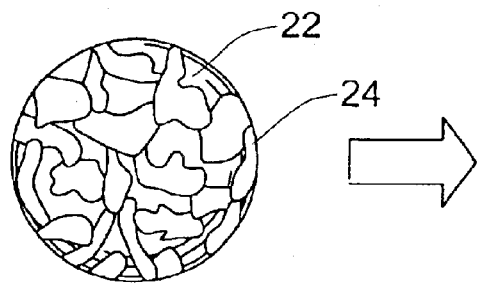
FIGS. 3A and 3B are diagrams showing a process for forming a coupler.
Figure 3B:
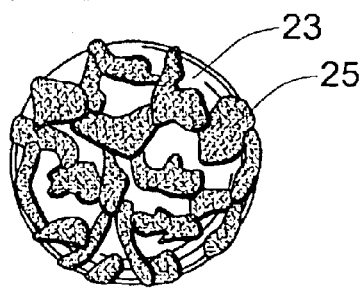

A coupler 20b of Embodiment 2, as shown in FIG. 3B, has a solder region 25 (electroconductive region) formed on metal powders and a resin region 23, which are alternately formed on the surface. A process for producing the coupler 20b having a mixture of the resin region and the electroconductive region will be described below with reference to the embodiment.

To 50 g of a polyacetal resin containing a filler (Tenac, produced by Asahi Kasei Corp.), 50 g of copper powder having an average particle diameter of 0.5 µm (produced by Vacuum Metallurgical Co.) were added and heated to produce a blend of polyacetal resin and copper powder. To 20 g of the resin containing copper powder thus obtained, 50 g of a neat polyacetal resin (a pure resin without filler) was added in a stainless steel crucible and heated at 300° C. under a nitrogen stream to prevent progress of oxidation, and the mixture were then agitated for 5 minutes, followed by cooling.

The mixed resin was then put in a stainless steel vessel and again heated to 300° C., and thereafter, the resin was injected in a cast of a ball form, followed by cooling, to obtain resin balls. A resin region 23 having no metal powder and a region having metal powder 24 were formed alternately on the surface of the resin ball as shown in FIG. 3A. A solder material, ECO Solder M31, available from Senju Metal Industry Co. was melted in a solder crucible, into which the resin balls were dipped for one second to obtain a coupler 20b. A resin region 23 having no metal powder and a solder region 25 formed on the metal powder were formed alternately on the surface of the coupler 20b.

The metal to be mixed with the heat resistant resin is not limited to copper. A wide variety of metals and alloys that can be combined with solder, such as nickel, are employed.

Embodiment 3

Figure 4A:
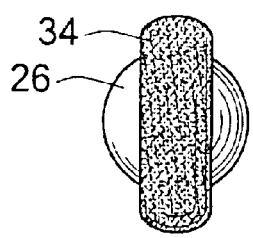
FIGS. 4A and 4B are an elevational view and a side view, respectively, showing an appearance of a coupler.
Figure 4B:
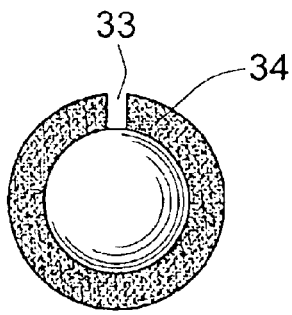

A coupler 20c of Embodiment 3 has a strip solder layer 34 (electroconductive region) with an opening 33 on a surface of a resin ball 26 which is formed from a heat resistant resin as shown in FIGS. 4A and 4B. An area on the surface which is not covered with the strip solder layer 34 corresponds to the resin region of the coupler 20c. Although the coupler achieves its function even when the opening 33 is not present, the opening 33 relaxes stress applied to the strip solder layer 34 on thermal expansion of the resin ball 26, so as to improve the cracking resistance of the coupler 20c. A process for producing the coupler 20c having such a structure will be described below with reference to the embodiment.

Figure 5:
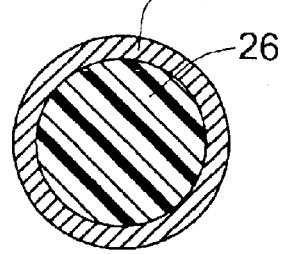
FIG. 5 is a cross sectional view showing a structure of a resin ball.

A resin ball 26 (diameter; 300 µm) formed by casting a liquid crystal polymer (Vectra, available from Polyplastics Co.) was subjected to an electroless plating treatment in an electroless plating solution of Shipley Company, so as to form a resin ball 26b having a metal layer 27 of copper which covered the entire surface of the ball (see FIG. 5).

The metal layer 27 is not limitedly formed by electroless plating. As far as the metal layer 27 can be formed on the resin ball 26, other methods, like a dry process, such as vapor deposition and sputtering, are also applied.

Figure 6A:
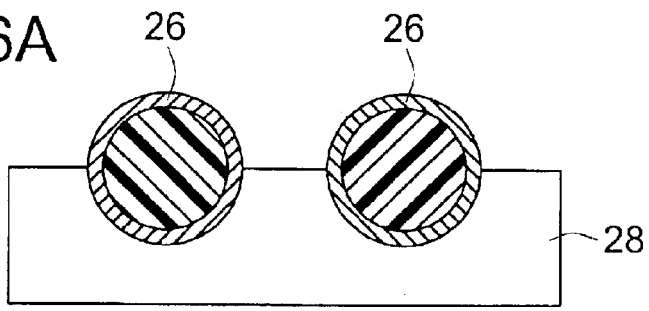
FIGS. 6A to 6C are diagrams showing a process for forming a coupler.
Figure 6B:
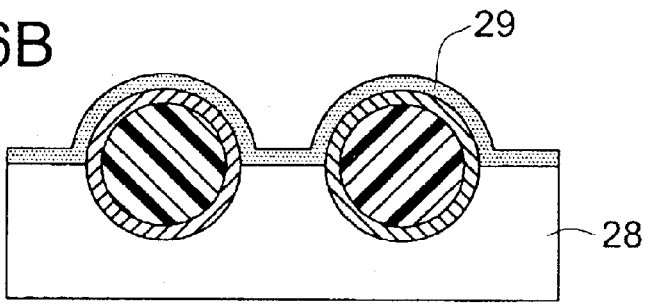

The resin balls 26b with copper layer were put on a ball fixing plate 28 as shown in FIG. 6A. A positive photosensitive resist (AZ8100, available from Clariant Japan Co.) was coated thereon by spraying, followed by drying in an oven at 85° C. for 60 seconds, so as to form a photosensitive resist layer 29 having a thickness of about 3.0 µm as shown in FIG. 6B. The foregoing procedures were made twice to prepare the resin balls 26c having the photosensitive resist layer 29 on up and bottom sides of the metal layer 27.

Figure 6C:
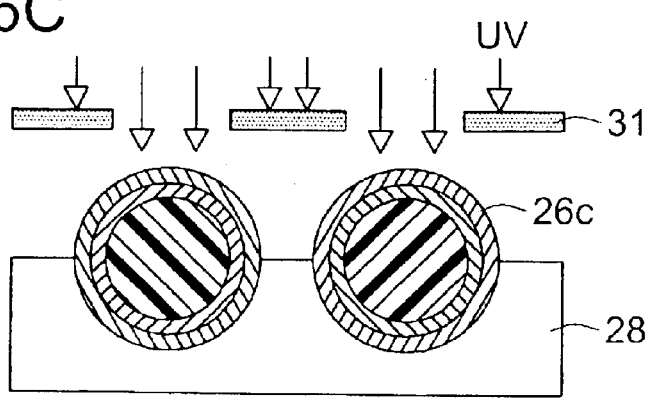

The resin balls 26c on the ball fixing plate 28 were irradiated with an ultraviolet ray (exposure amount: 100 mJ/cm$^2$), by using a mask aligner produced by Ushio Inc., twice in total, as shown in FIG. 6C. At this time, different masks 31 were used for the first exposure and the second exposure. FIG. 7A shows a mask 31a used for the first exposure, which has slits between a transparent part and a shielded part. FIG. 7B shows a mask 31b used for the second exposure, which has no slit between a transparent part and a shielded part. The mask 31a was positioned to make the slits overlap the center part of the resin balls 26c as shown in FIG. 7A.

After the exposure, the resin balls were subjected to a heat treatment in a circulation oven at 85° C. for 90 seconds as post-exposure baking. The balls were then subjected to a development treatment in a solution of an alkali developer (NMD-3, available from Tokyo Ohka Kogyo Co.) with vigorous stirring, and thereafter, they were subjected to a water washing treatment, so as to obtain a resin ball 26d having a resist pattern 32 on a metal layer 27 as shown in FIGS. 8A and 8B.

The resist pattern 32 which was formed encirclingly on the metal layer 27 had an opening 33 to make both ends open. The resist and the method of forming the resist pattern were not limited to those described herein, and various resists and methods corresponding thereto can be employed.

The resin ball 26d was then agitated in a hydrochloric acid aqueous solution of 10% by weight at 25° C. to etch the metal layer 27, remaining some area which was covered with the resist pattern 32. The resist pattern 32 was then removed in an acetone solution to obtain a resin ball 26e (not shown in the figure) having an encircling copper strip on the surface. The resin ball 26e was dipped in a solder bath for one second to obtain a coupler 20c having a strip solder layer 34 and a resin region as shown in FIGS. 4A and 4B.

The strip solder layer 34 is obtained by other methods that can form the solder layer on copper, etc., for example, a plating method using solder plating and a solder jet method of spraying molten solder, in addition to the method of dipping in a solder bath. The metal composition of the solder thus used is also not restrictive.

While this embodiment used a single wide strip as the strip solder layer 34, a plurality of narrow strips layers, for example, will achieve the same effect. It is required that the electroconductive region and the resin region are mixedly present on the surface of the coupler.

Embodiment 4

A method of using the coupler 20 will be described with reference to the following embodiment. The equipment and processes for mounting the conventional solder balls were used for coupler 20. A semiconductor chip 1, shown in FIG. 9, having pads 4a disposed on the substrate in 15×15 pieces, with a blank area of 7×7 at the center, 176 pieces in total, was used to assemble a device using the coupler 20. However, the invention is not construed as being limited by the equipment used, the number of pads, and the size of the semiconductor chip.

The configuration of the pad 4a was determined from the size of the semiconductor chip 1 and the number of electrodes required for the operation of the semiconductor chip 1. The pads 4a had a width of 0.3 mm and a pitch of 0.8 mm.

The pads 4a of the semiconductor chip 1 were spray-coated with a cleansing-free aerosol flux of resin type produced by Japan Pulse Laboratories, Inc. The couplers 20 were then retained on the pads 4a of the semiconductor chip 1 by using a handy solder ball mounter (BM-11 series, products of Japan Pulse Laboratories, Inc.). A jig 41 was used for positioning of the couplers 20 and the pads 4a, as shown in FIG. 10.

In a case where the coupler 20c having an opening 33 was on the pad 4a, it was necessary to arrange the coupler 20c in such a manner that the opening 33 finally stayed substantially at the center of the semiconductor chip 1 and the organic printed circuit board 5. Locating the opening 33 in such a position improved the cracking resistance of the coupler, because the opening 33 was free from the pads 4a and 4b even after the assembling was completed and enabled the relaxation of stress caused by the difference in thermal expansion coefficients by deformation.

The coupler 20 had implicitly a spherical shape in the foregoing description. This was because the spherical shape of the coupler kept the distance between the semiconductor chip and the organic printed circuit board constant at any arrangements of the coupler. However, the coupler may have other shapes, such as a cubic shape and an ellipsoidal shape, if an appropriate jig for fixing the coupler is obtained. Particularly, in the case where the coupler has anisotropy in shape by providing the opening 33, a cubic coupler has an advantage of the positional stability and makes it easy to determine the direction of the opening 33.

Figure 10:
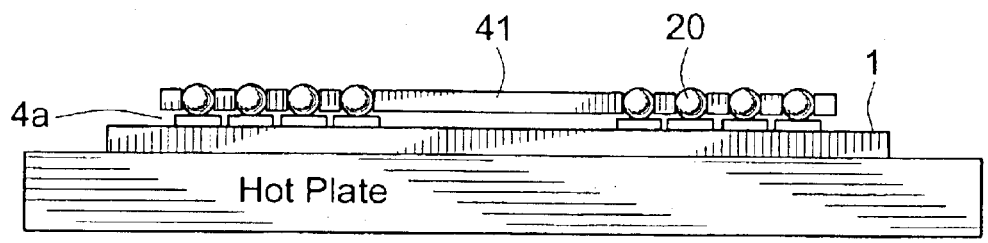
FIG. 10 is a diagram showing a method for positioning couplers on a semiconductor chip.
Figure 11:
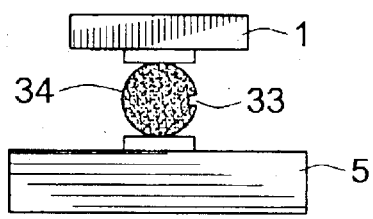
FIG. 11 is a diagram showing a method for fixing a coupler between electrodes (pads).

The semiconductor chip 1 having the couplers 20 retained thereon was placed on a hot plate heated to 280° C. under a nitrogen stream to melt solder (see FIG. 10). After the melt of solder, the semiconductor chip 1 was released from the hot plate to cool at a room temperature, and thus connection between the pads 4a of the semiconductor chip 1 and the couplers 20 was achieved.

Figure 12:
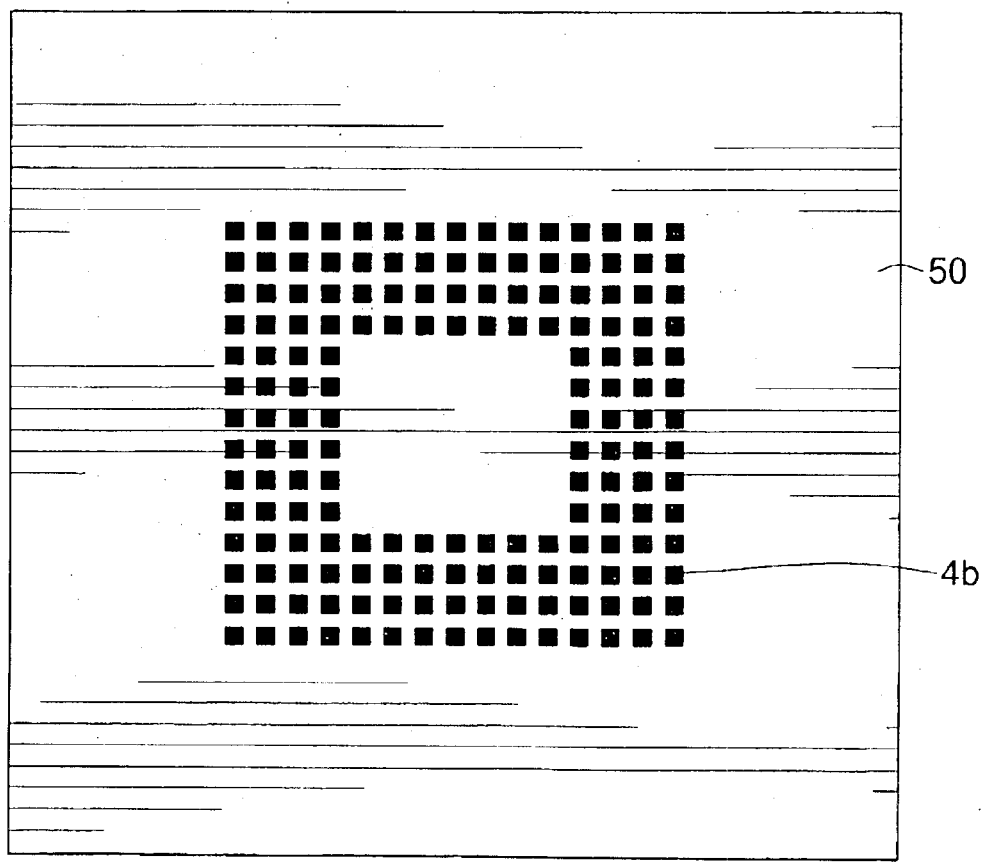
FIG. 12 is a top view of an organic printed circuit board (wiring substrate) with a plurality of electrodes having a prescribed area formed thereon.

An FR4 substrate 50 had a size of 50 mm and a thickness of 1.2 mm. Copper pads 4b (with a film thickness of 30 $\mu$m) were formed on the FR4 substrate 50 in the same arrangement as the pads 4a formed on the semiconductor chip 1 (see FIGS. 9 and 12).

The semiconductor chip 1 having the couplers 20 connected thereon was fixed to make the couplers 20 in contact with the pads 4b of the FR4 substrate 50 (see FIG. 1). The assembly was then heated to 280° C. by using an infrared solder ref lowing apparatus (RF110N2, produced by Japan Pulse Laboratories, Inc.). Cooing the assembly at a room temperature completed the connection between the semiconductor chip 1 and the FR4 substrate 50 through the couplers 20. The foregoing procedures were effective for the couplers 20a, 20b and 20c.

The reliability of the couplers 20 according to the invention for assembling a semiconductor chip 1 was evaluated. The results obtained will be described below. In addition to the couplers 20a, 20b and 20c, couplers 20d, 20e and 20f were evaluated. The coupler 20d was obtained in much the same manner as that to obtain the coupler 20c, except that a thermosetting epoxy resin was used instead of the liquid crystal polymer (Vectra). In a similar manner, the coupler 20e was obtained by using a mixture of a thermosetting epoxy resin and PES (polyether sulfone) at a weight ratio of 70/30, and the coupler 20f was obtained by using a mixture of a thermosetting epoxy resin and a thermosetting phenol resin at a weight ratio of 80/20.

As comparative couplers, solder balls (Sparkle Ball S Type, available from Senju Metal Industry Co.), Cu-core balls (Sparkle Ball C type, available from Senju Metal Industry Co.) and copper balls (available from Sumitomo Special Metals Co.) were provided. The couplers thus obtained all had a diameter of 300 $\mu$m.

Figures 13, 14:
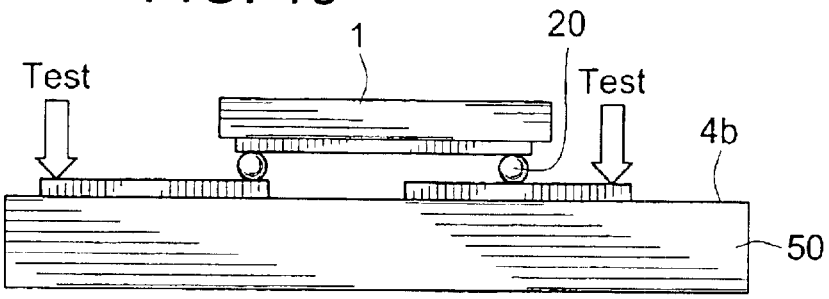
FIG. 13 is a diagram showing a method for evaluating the reliability of couplers.
FIG. 14 is a table showing the results of reliability test of couplers.
Figure 15:
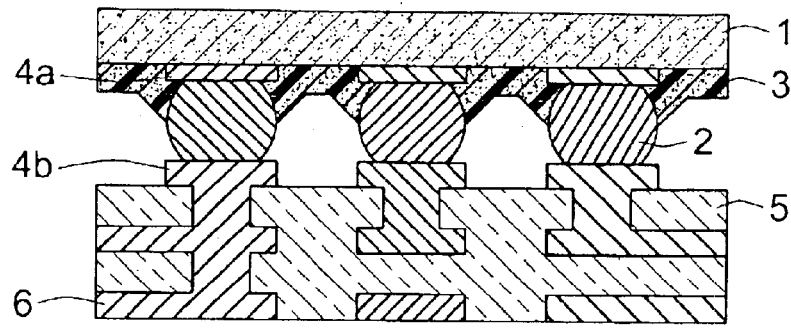
FIG. 15 is a cross sectional view of a conventional electronic device using solder balls reinforced with a resin.
Figure 16:
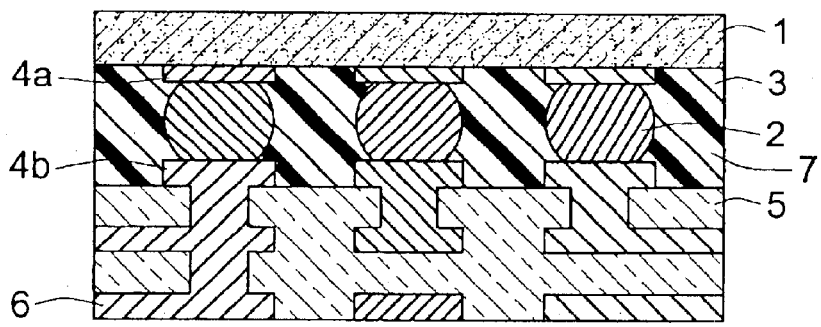
FIG. 16 is a cross sectional view of another conventional electronic device using solder balls embedded in an underfill layer.
Figure 17:
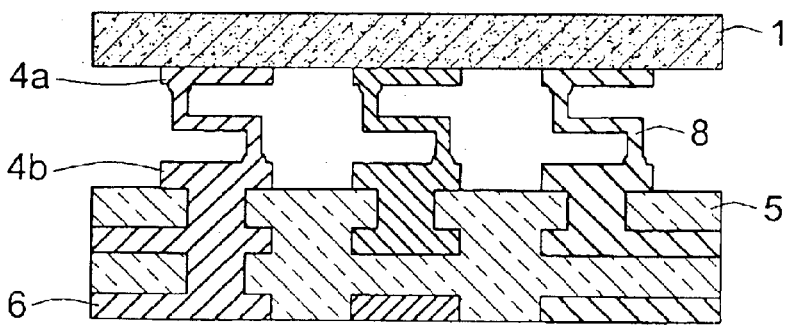
FIG. 17 is a cross sectional view of the other conventional electronic device using wire-bonded connecting electrodes.

The nine kinds of foregoing couplers were used to assemble a semiconductor chip on an FR4 substrate 50, and the assemblies were subjected to a thermal shock test for evaluating the reliability of connection after assembling. The conductivity between a pair of connecting points, as shown in FIG. 13, was measured, every time 100 cycles of the heat shock (cycle temperature: −65° C. to 125° C., retention time: 15 to 30 minutes) were performed on the assemblies. Each of the FR4 substrates had 88 pairs of connecting points in total.

The data were shown in FIG. 14. The numerals shown in the figure denote the point number of conduction failure/the total number of connecting points. In the case where the comparative couplers were used for assembling, cracking was formed in the couplers located at the outermost circumference of the semiconductor chip 1 to cause conduction failure after 400 to 800 cycles were performed. On the contrary, in the case where the couplers 20a to 20f according to the invention were used for assembling, cracking was not found in the couplers and no conduction failure occurred even after 1,000 cycles of the thermal shock test were performed. The data confirm that the couplers 20 according to the invention have remarkably high cracking resistance and realize highly reliable connection.

What is claimed is:

1. An electronic device comprising:
   an element-carrying-substrate having an electronic element and a first electrode, the first electrode being disposed on a surface of the element-carrying-substrate and having a first area;
   a wiring substrate facing the element-carrying-substrate and having a second electrode disposed on a surface of said wiring substrate, the second electrode having a second area and facing the first electrode; and
   a coupler disposed between the first electrode and the second electrode, joining the element-carrying-substrate to the wiring substrate, the coupler including a resin body with a surface, and an electrically conductive member occupying from 20% to 80% of the surface of the resin body and electrically connecting the first electrode to the second electrode.

2. The electronic device as claimed in claim 1, wherein the electrically conductive member is a joining metal.

3. The electronic device as claimed in claim 1, wherein the electrically conductive member comprises a metal powder and a joining metal film, the metal powder being joined to the joining metal film.

4. The electronic device as claimed in claim 1, wherein the electrically conductive member comprises a metal strip layer joined to a joining metal film, the metal strip layer encircling the resin body.

5. The electronic device as claimed in claim 4, wherein the metal strip layer has an opening disposed substantially at a center of the element-carrying-substrate and the wiring substrate.

6. The electronic device as claimed in claim 1, wherein the resin body comprises a thermosetting resin.

7. The electronic device as claimed in claim 1, wherein the resin body comprises a thermoplastic resin.

8. A coupler with a spherical shape comprising a resin body having a surface and an electrically conductive member comprising a blend of a joining metal and a resin occupying from 20% to 80% of the surface of the resin body.

9. The coupler as claimed in claim 8, further comprising a metal powder, wherein the metal powder located on the surface of the resin body is joined to the joining metal.

10. The coupler as claimed in claim 9, wherein the resin body comprises a thermosetting resin.

11. The coupler as claimed in claim 9, wherein the resin body comprises a thermoplastic resin.

* * * * *